US009847272B2

(12) United States Patent
Tan et al.

(10) Patent No.: US 9,847,272 B2
(45) Date of Patent: Dec. 19, 2017

(54) THREE-DIMENSIONAL INTEGRATED CIRCUIT STRUCTURES PROVIDING THERMOELECTRIC COOLING AND METHODS FOR COOLING SUCH INTEGRATED CIRCUIT STRUCTURES

(71) Applicant: GLOBALFOUNDRIES Singapore Pte. Ltd., Singapore (SG)

(72) Inventors: Juan Boon Tan, Singapore (SG); Wei Liu, Singapore (SG); Kheng Chok Tee, Singapore (SG); Kam Chew Leong, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 690 days.

(21) Appl. No.: 14/138,593

(22) Filed: Dec. 23, 2013

(65) Prior Publication Data
US 2015/0179543 A1 Jun. 25, 2015

(51) Int. Cl.
F25B 21/00 (2006.01)
F25B 21/02 (2006.01)
(Continued)

(52) U.S. Cl.
CPC .......... *H01L 23/38* (2013.01); *H01L 25/0657* (2013.01); *H01L 23/3677* (2013.01); *H01L 23/481* (2013.01); *H01L 23/49816* (2013.01); *H01L 23/49827* (2013.01); *H01L 24/05* (2013.01); *H01L 24/06* (2013.01); *H01L 24/13* (2013.01); *H01L 24/16* (2013.01); *H01L 24/17* (2013.01); *H01L 24/32* (2013.01); *H01L 24/73* (2013.01); *H01L 2224/0401* (2013.01); *H01L 2224/0557* (2013.01); *H01L 2224/06181* (2013.01); *H01L 2224/131* (2013.01); *H01L 2224/16146* (2013.01); *H01L 2224/16225* (2013.01); *H01L 2224/17181* (2013.01); *H01L 2224/32225* (2013.01);
(Continued)

(58) Field of Classification Search
CPC .......... F25B 21/00; F25B 21/02; F25B 21/04; F25B 2321/023; H01L 23/38; H01L 23/48; H01L 23/2677; H01L 35/00; H01L 35/04
See application file for complete search history.

(56) References Cited
U.S. PATENT DOCUMENTS 3,510,364 A * 5/1970 Bucs .................. H01L 35/10
136/239
7,893,529 B2 2/2011 Hsu et al.
(Continued)

*Primary Examiner* — Grant Moubry
*Assistant Examiner* — Erik Mendoza-Wilkenfel
(74) *Attorney, Agent, or Firm* — Lorenz & Kopf, LLP

(57) ABSTRACT

Three-dimensional integrated circuit structures providing thermoelectric cooling and methods for cooling such integrated circuit structures are disclosed. In one exemplary embodiment, a three-dimensional integrated circuit structure includes a plurality of integrated circuit chips stacked one on top of another to form a three-dimensional chip stack, a thermoelectric cooling daisy chain comprising a plurality of vias electrically connected in series with one another formed surrounding the three-dimensional chip stack, a thermoelectric cooling plate electrically connected in series with the thermoelectric cooling daisy chain, and a heat sink physically connected with the thermoelectric cooling plate.

16 Claims, 3 Drawing Sheets

(51) Int. Cl.
*F25B 21/04* (2006.01)
*H01L 35/00* (2006.01)
*H01L 35/04* (2006.01)
*H01L 23/38* (2006.01)
*H01L 23/48* (2006.01)
*H01L 25/065* (2006.01)
*H01L 23/367* (2006.01)
*H01L 23/00* (2006.01)
*H01L 23/498* (2006.01)

(52) U.S. Cl.
CPC ........... *H01L 2224/73204* (2013.01); *H01L 2225/06513* (2013.01); *H01L 2225/06517* (2013.01); *H01L 2225/06541* (2013.01); *H01L 2225/06565* (2013.01); *H01L 2225/06589* (2013.01); *H01L 2924/0002* (2013.01); *H01L 2924/10252* (2013.01); *H01L 2924/10253* (2013.01); *H01L 2924/10329* (2013.01); *H01L 2924/13091* (2013.01); *H01L 2924/14* (2013.01); *H01L 2924/15311* (2013.01)

(56) References Cited

U.S. PATENT DOCUMENTS

| | | | |
|---|---|---|---|
| 2009/0231851 A1* | 9/2009 | Lai | F21V 29/004 362/253 |
| 2011/0042805 A1* | 2/2011 | Yu | H01L 35/32 257/737 |
| 2011/0085304 A1* | 4/2011 | Bindrup | H01L 21/4871 361/718 |
| 2012/0074515 A1* | 3/2012 | Chen | H01L 23/585 257/491 |
| 2012/0201008 A1* | 8/2012 | Hershberger | H05K 1/0203 361/720 |
| 2012/0217628 A1* | 8/2012 | Chou | H01L 23/3677 257/692 |
| 2013/0139524 A1* | 6/2013 | Kim | F25B 21/02 62/3.7 |

* cited by examiner

THREE-DIMENSIONAL INTEGRATED CIRCUIT STRUCTURES PROVIDING THERMOELECTRIC COOLING AND METHODS FOR COOLING SUCH INTEGRATED CIRCUIT STRUCTURES

TECHNICAL FIELD

The present disclosure generally relates to integrated circuit structures and methods for cooling integrated circuit structures. More particularly, the present disclosure relates to three-dimensional integrated circuit structures providing thermoelectric cooling and methods for cooling such integrated circuit structures.

BACKGROUND

The majority of present day integrated circuits are implemented by using a plurality of interconnected field effect transistors (FETs), also called metal oxide semiconductor field effect transistors (MOSFETs), or simply MOS transistors. A MOS transistor includes a gate electrode as a control electrode and spaced apart source and drain regions between which a current can flow. A control voltage applied to the gate electrode controls the flow of current through a channel between the source and drain regions.

To provide multiple integrated circuits into a compact device, such as a cell phone, PDA, GPS, or laptop computer, fabricating an integrated circuit structure having a three-dimensional ("3D") integrated circuit stack or "chip stack" has recently been investigated. A 3D chip stack allows designers or assemblers greater flexibility to stack various chip technologies into small, high performance functional blocks. For example, flash memories combined with static random access memory (SRAM), dynamic random access memory (DRAM), digital signal processors (DSP), or microprocessors are all candidates for this 3D chip stack technique. It may even be possible stack silicon-based chips with Periodic Table group III-V material compound chips, which cannot be easily fabricated monolithically.

3D chip stacks may need to include a cooling mechanism. When two chips are bonded together, one side of each chip is exposed to the air, which can be cooled by the ambient cool air. However, when more chips are bonded together, such as in a 3D chip stack, chips in the middle are not exposed to ambient air. Lack of exposure to ambient air for middle chips may not be a problem for chips that consume less power. For example, memory chips generally consume less power than high-speed central processing unit (CPU) chips, and therefore, memory chips generate less heat, than CPU chips. Therefore, a separate cooling mechanism would not necessarily be required for a 3D memory chip stack. For high-speed CPU chips, however, which consume more power, and therefore generate more heat, a separate cooling mechanism may be necessary for a 3D CPU chip stack.

Accordingly, it is desirable to provide improved integrated circuit structures and methods for fabricating integrated circuits that are able to efficiently dissipate heat generated as a result of power consumption. Additionally, it is desirable to provide three-dimensional integrated circuit structures methods for fabricating such integrated circuit structures with a cooling mechanism for eliminating heat generated at portions thereof that are not exposed to ambient cool air. Furthermore, other desirable features and characteristics of the present disclosure will become apparent from the subsequent detailed description and the appended claims, taken in conjunction with the accompanying drawings and the foregoing technical field and background.

BRIEF SUMMARY

Three-dimensional integrated circuit structures providing thermoelectric cooling and methods for cooling such integrated circuit structures are disclosed. In one exemplary embodiment, a three-dimensional integrated circuit structure includes a plurality of integrated circuit chips stacked one on top of another to form a three-dimensional chip stack, a thermoelectric cooling daisy chain including a plurality of vias electrically connected in series with one another formed surrounding the three-dimensional chip stack, a thermoelectric cooling plate electrically connected in series with the thermoelectric cooling daisy chain, and a heat sink physically connected with the thermoelectric cooling plate.

In another exemplary embodiment, a method of cooling a three-dimensional integrated circuit structure includes forming a thermoelectric cooling daisy chain including a plurality of vias electrically connected in series with one another surrounding a three-dimensional chip stack including a plurality of integrated circuit chips stacked one on top of another. The thermoelectric cooling daisy chain is electrically connected in series with a thermoelectric cooling plate, and a heat sink is physically connected with the thermoelectric cooling plate. The method further includes passing an electrical current through the thermoelectric cooling daisy chain and the thermoelectric cooling plate to direct heat generated in the three-dimensional chip stack into the thermoelectric cooling plate and the heat sink and dissipating the generated heat from the heat sink into an ambient environment.

BRIEF DESCRIPTION OF THE DRAWINGS

The present disclosure will hereinafter be described in conjunction with the following drawing figures, wherein like numerals denote like elements, and wherein.

DETAILED DESCRIPTION

The following detailed description is merely illustrative in nature and is not intended to limit the embodiments of the subject matter or the application and uses of such embodiments. Furthermore, there is no intention to be bound by any expressed or implied theory presented in the preceding technical field, background, brief summary or the following detailed description.

The present disclosure provides three-dimensional integrated circuit structures providing thermoelectric cooling. For the sake of brevity, conventional techniques related to integrated circuit device fabrication may not be described in detail herein. Moreover, the various tasks and process steps described herein may be incorporated into a more comprehensive procedure or process having additional steps or functionality not described in detail herein. In particular, various steps in the manufacture of semiconductor-based transistors are well-known and so, in the interest of brevity, many conventional steps will only be mentioned briefly herein or will be omitted entirely without providing the well-known process details.

As noted above, embodiments of the present disclosure are generally directed to thermoelectric cooling in three-dimensional (3D) integrated circuits. In accordance with some embodiments, a thermoelectric cooling (TEC) plate is provided for removing heat from a plurality of stacked integrated circuits or "chips". Each chip has electronic devices (such as transistors, resistors, and the like) embedded therein, as is known in the art. To provide thermoelectric cooling to the chip stack, through silicon vias (TSVs) are used to form an electrical "daisy chain" surrounding (but not within the active areas 299 of) the chips, as will be described in greater detail below, to transfer heat generated by the 3D chip stack to a heat sink associated with the TEC plate. These TSVs are provided surrounding the exterior of the chip stack solely for the purposes of thermoelectric cooling, and are provided separate from and in addition to any TSVs that may be required to complete the logical connections between the various integrated circuits of the 3D chip stack. The TEC plate is connected with the TSV daisy chain on one side thereof, and with the heat sink on the other side thereof. Thus, heat is transferred from the TSV daisy chain to the TEC plate, and thereafter to the heat sink, which effectively dissipates the heat generated by the chips in the 3D stack.

Figure 1:
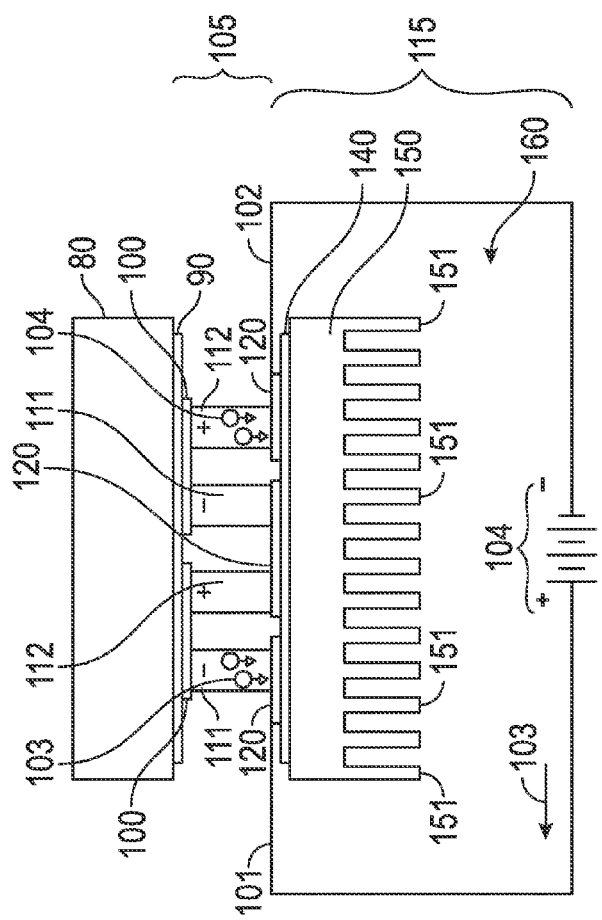
FIG. 1 is a schematic illustration showing an abstracted cooling mechanism in accordance with various embodiments of the present disclosure.
Figure 2:
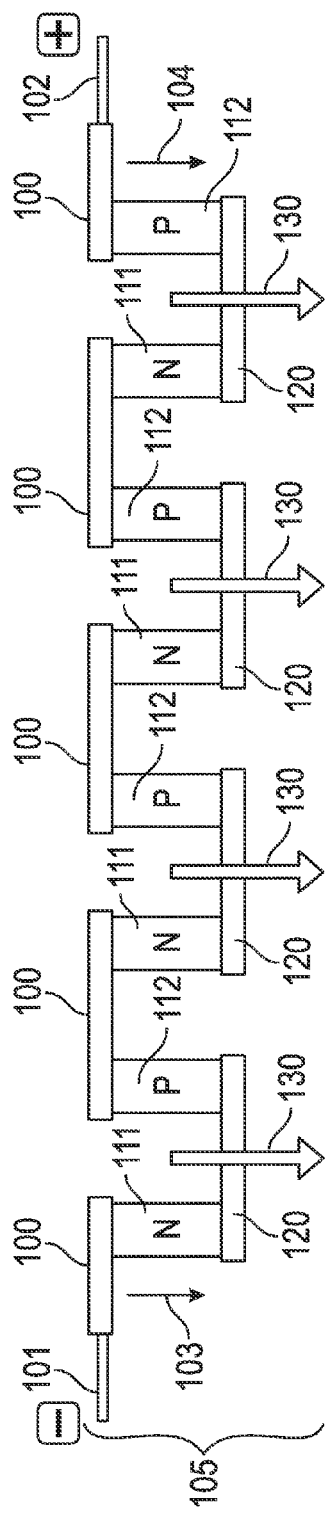
FIG. 2 is a schematic illustration showing heat flow versus current flow in the abstracted cooling mechanism illustrated in FIG. 1.
Figure 3:
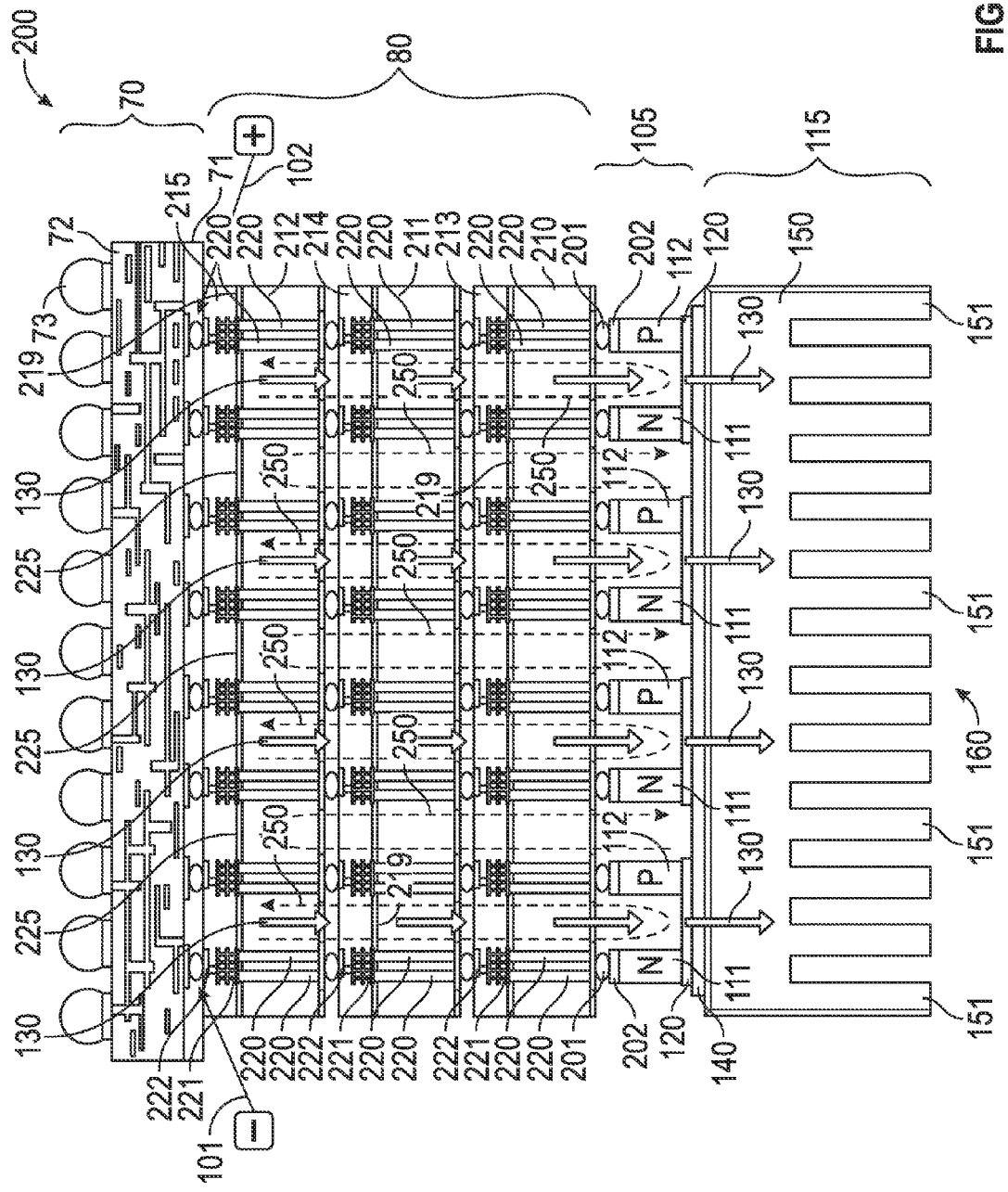
FIG. 3 is a side cross-sectional view of an exemplary three-dimensional integrated circuit structure employing thermoelectric cooling in accordance with various embodiments of the present disclosure.
Figure 4:
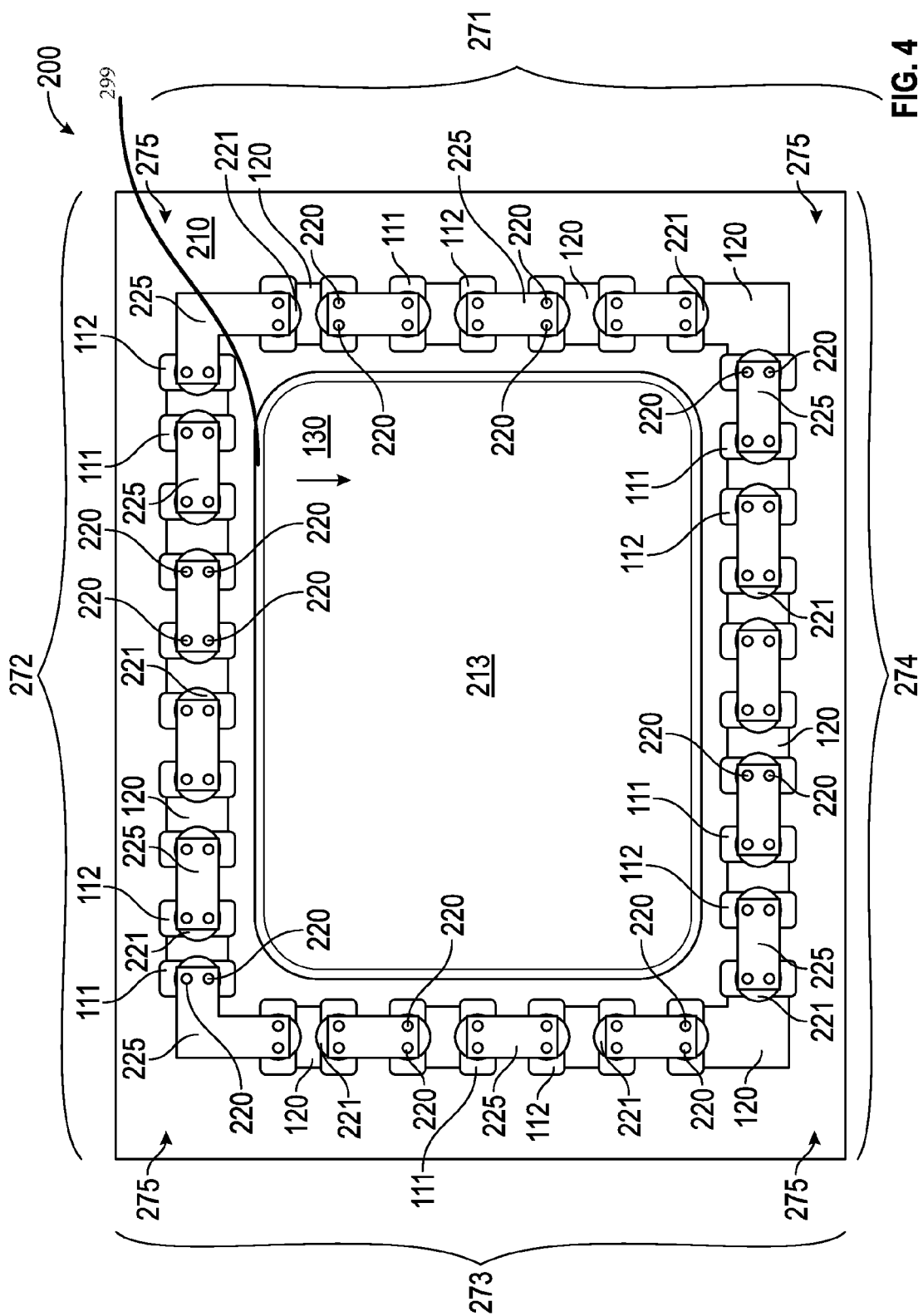
FIG. 4 is a top cross-sectional view of the three-dimensional integrated circuit structure illustrated in FIG. 3.

FIGS. 1 and 2 of the present disclosure provide an abstracted overview of the thermoelectric cooling mechanism of the present disclosure, and in particular of the TEC plate and the heat sink. FIGS. 3 and 4 then provide an illustration of the thermoelectric cooling mechanism implemented on an exemplary 3D integrated circuit chip stack in connection with the above-noted TSV daisy chain. With reference now to FIGS. 1 and 2, a TEC plate 105 is illustrated that serves as a solid-state heat pump, and includes of multiple pairs of N-type and P-type semiconductor pellets 111, 112, respectively, as thermoelectric elements connecting electrically in series and thermally in parallel. Semiconductor pellets may be formed of, for example, appropriately doped bismuth telluride ($Bi_2Te_3$). In particular, the electrical connection in series is illustrated by arrows 103 and 104, which respectively illustrate the direction of electrons and holes through the paired semiconductors, with electrical connections 101 and 102 providing suitable entry and exits points for the flow of electrical current therethrough, and with electrical bridging connections 100 and 120 providing suitable electrical connections between the semiconductor pellet pairs 111, 112. The thermal connection in parallel is illustrated by arrows 130, which illustrate the flow of heat through and out of the TEC plate 105.

With particular attention to FIG. 1, TEC plate 105 is thermally connected with an abstracted chip stack 80 on one side thereof via a first connecting plate 90, and also with a heat sink 115 on the other side thereof via a second connection plate 140. In such situation shown in FIG. 1, heat is transferred downward against the temperature gradient, with the heat flow again being indicated by arrows 130 (FIG. 2). First and second connecting plates 90, 140 are placed between the TEC plate 105 and the chip stack 80, and between the TEC plate 105 and the heat sink 115, and serve as electrical insulators and provide efficient heat transfer between the 3D chip stack 80, the TEC plate 105, and the heat sink 115. Dielectric materials with good thermal conductivity, such as chemical vapor-deposited (CVD) diamond or silicon carbide (SiC), are exemplary materials that may be used for the first and second connecting plates 90, 140.

With continued reference to FIG. 1, the heat sink 115 may be implemented using any thermally conductive material, such a metal, ceramic, or a silicon-based material. Heat sink 115 generally includes a bulk portion 150 that is provided adjacent to the second connecting plate 140 on one side thereof, and a plurality of fin structures 151 that extend from the other side of the bulk portion 150. Fin structures 151 provide enhance convectional cooling with the surrounding ambient 160 (such as air), as is generally known in the art. A fan or other circulation means (not illustrated) may be provided to improve the ambient 160 flow around the fins 151.

Reference is now made to FIGS. 3 and 4, which illustrate side and top cross-sectional views, respectively, of an exemplary three-dimensional integrated circuit structure 200 employing thermoelectric cooling in accordance with various embodiments of the present disclosure. In order to better illustrate the described embodiments, the cross-sectional views in FIGS. 3 and 4 are not taken through a single plane; rather, components at various depths within the integrated circuit structure are illustrated adjacent to one another, as will be discussed in greater detail below. Furthermore, although the embodiments illustrated in FIGS. 3 and 4 show a three-dimensional integrated circuit structure include three integrated circuit chips 210-212, it will be appreciated that a chip stack including any number of integrated circuits may be provided.

As shown particularly in FIG. 3, the integrated circuit chips 210-212 may include a silicon substrate having any of the known surface crystal orientations. The term "silicon substrate" is used herein to encompass the relatively pure silicon materials typically used in the semiconductor industry as well as silicon admixed with other elements such as germanium, carbon, and the like. A silicon substrate may be a bulk silicon wafer (as illustrated), or may be a thin layer of silicon on an insulating layer (commonly known as silicon-on-insulator or SOI) that, in turn, is supported by a carrier wafer. Alternatively, the silicon substrate can be germanium, gallium arsenide, or other semiconductor material. Additionally, as is known in the art, each of the integrated circuit chips 210-212 may have formed thereover one or more insulating material layers 219 and one or more conductive layers 213-215, respectively.

Additionally, the 3D chip stack 80 may have formed thereover an organic printed circuit board (PCB)-like substrate 70 used in normal chip packaging. The functional chip or 3D chip stack 80 is bonded on substrate 70 to form a complete chip packaging. Substrate 70 may generally include an insulation layer 71 to provide electrical insulation from the 3D chip stack 80, a plurality of metallization lines 72, and a ball grid array (BGA) 73, as is generally known in the art.

As further shown particularly in FIG. 3, TEC plate 105 and heat sink 115 are provided as described above with regard to FIGS. 1 and 2. Namely, TEC plate 105 is thermally connected with the 3D chip stack 80 on one side thereof, and also with a heat sink 115 on the other side thereof via connection plate 140. However, unlike the abstracted illustration shown in FIGS. 1 and 2, the TEC plate 105 is not connected with the 3D chip stack 80 via a unitary connection plate 90. Rather, each of the N-type and P-type semiconductor pellets 111, 112 are electrically connected with a TSV 220, such TSVs being some of the plurality of TSVs that form an electrically-connected TSV daisy chain that surrounds the 3D integrated circuit chip stack. More particularly, each of the N-type and P-type semiconductor pellets 111, 112 are connected to a cell 220, which may contain one or more TSVs for redundant purposes to allow more electric and thermal conduction capability (and are referred to herein by the non-limiting example of TSVs hereinafter for simplicity), by means of first and second electrical connection structures 201, 202 (for example, structure 201 may be a solder bump to connect the N or P type pellet with the pad below the TSV cell 220; structure 202 may be a metal plate on the N or P type pellet to serve as an interface to solder bump 201). The TSVs 220 may be formed of (i.e., filled with) one or more high thermal conductivity metals, for example copper (Cu), tungsten (W), or aluminum (Al), as is known in the art.

As noted above, a TSV daisy chain is formed surrounding the 3D chip stack 80 to transfer heat generated by the 3D chip stack to a heat sink. These TSVs are provided surrounding the exterior of the chip stack 80 solely for the purposes of thermoelectric cooling, and are provided separate from and in addition to any TSVs that may be required to complete the logical connections between the various integrated circuits of the 3D chip stack, as will be dictated by the design of the chip stack 80. Thus, the TSV daisy chain has the benefit of being useful in any 3D chip stack configuration; that is, the chip designer does not need to configure the logic TSVs with cooling in mind. Additionally, as the TSV daisy chain is provided surrounding the chip stack 80, the fabrication thereof will be compatible with any of the existing 3D integrated circuit fabrication technologies.

The TSV daisy chain is formed by providing a TSV, or as noted above a cell of more than one TSVs, directly above each of the N-type and P-type semiconductor pellets 111, 112 of the TEC plate in each of the integrated circuit chips 210-212. Thus, in the exemplary embodiment shown in FIG. 3, which includes three integrated circuit chips 210-212 in the stack 80, three TSVs 220 will be stacked in vertical succession over each for the semiconductor pellets 111, 112, as illustrated. The three TSVs 220 above each semiconductor 111, 112 are connected in series to one another by electrical connection means 221 and 222 (for example, means 221 may indicate the normal multiple-layer metal lines in a logic chip; means 222 may indicate the metal pad to serve as a interface for solder bump bonding. Within the TEC plate 105, as noted above, the semiconductor pellets 111, 112 are electrically connected to one another in series by bridging connections 120. This bridging connection thus electrically connects two adjacent TSV vertical stacks (i.e., the vertical TSV stacks formed over the bridged semiconductor pellets 111, 112). Instead of providing a further bridging connection 100, as was shown in FIGS. 1 and 2, vertical TSV stacks are also electrically connected to one another in series by bridging connections 225, as shown in FIGS. 3 and 4, which are placed within the insulating layer 219 of the top chip (i.e., chip 212, or the chip that is closest to the back-end metallization layer 70 and furthest from the TEC plate 105) in the 3D chip stack 80. Bridging connections 225 connect together vertical TSV stacks that are not connected to one another by bridging connections 120. For example, in a series of eight parallel, adjacent TSV stacks, such as shown in FIG. 3 (referred to as stacks 1 through 8 from left to right), stacks 1 and 2, 3 and 4, 5 and 6, and 7 and 8 are electrically connected to one another in series by bridging connections 120 of the TEC plate 105, and stacks 2 and 3, 4 and 5, and 6 and 7 are electrically connected to one another in series by bridging connections 225 over chip 212. The entry and exit electrical connections 101, 102 are provided at the top of stacks 1 and 8, respectively. Thus, from the entry electrical connection 101, the electrical current flows downwardly through TSV stack 1 to the TEC plate 105, through one of the bridging connections 120, then upwardly through TSV stack 2, then through one of the bridging connections 225, then downwardly through TSV stack 3, and further through successive TSV stacks 4, 5, 6, 7, and 8 in the same upward/downward manner, and finally through exit electrical connection 102. The electrical flow in this manner is generally indicated by dashed arrows 250. This TSV connection and electrical flow scheme thus forms the described TSV "daisy chain."

With particular attention to FIG. 4, as a top cross-sectional view, only the chip 213 is visible. The TSV daisy chain of TSVs 220 are shown surrounding, but not within, the active area 299 of chip 213. In this regard, TSV daisy chain has four sides 271-274, each of which being adjacent to a respective side of the rectangular 3D chip stack 80. At corners 275, bridging connections 120 and 225 may be characterized by an "L" shape to make the connection between two perpendicular sides. Thus, the TSV daisy chain may completely surround the chip stack to provide optimal thermoelectric cooling. Further, semiconductor pellets 111, 112 are shown connecting below the TSVs 225, and bridging connections 225 and 120 are shown connecting opposite vertical TSV stacks (in this respect the cross-section shown in FIG. 4 is not taken in a single plane, as initially noted above).

In general, fabrication of the 3D integrated circuit stack may be performed using processing steps that as are well-known in the art (not illustrated). These steps conventionally include, for example, preparing photolithographic masks and using the masks to pattern a plurality of features on the semiconductor wafer using material deposition and etching procedures, for example, the formation of semiconductive structures, the formation of metals gates, forming various insulating layers, the formation of doped source and drain regions, the formation of contacts (formed by depositing a photoresist material layer over the insulating layer, lithographic patterning, etching to form contact voids, and depositing a conductive material in the voids to form the contacts), and the formation of one or more patterned conductive layers, among many others. The subject matter disclosed herein is not intended to exclude any processing steps to form and test the completed 3D integrated circuits as are known in the art. Additionally, because the TSV daisy chain is fabricated surrounding, not within, the 3D integrated circuit chip stack, the fabrication thereof can be accomplished using the same techniques and technologies as the chips themselves, with only the need to additionally etch and deposit the cooling TSVs around the active areas 299 of the chips.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A three-dimensional integrated circuit structure comprising:
a plurality of integrated circuit chips stacked one on top of another to form a three-dimensional chip stack, wherein each integrated circuit chip comprises an active area;
a thermoelectric cooling daisy chain comprising a plurality of vias electrically connected in series with one another formed surrounding, but not passing through, the active area of each integrated circuit chip of the three-dimensional chip stack, wherein each individual chain of the daisy chain penetrates through each integrated circuit chip of the three-dimensional chip stack;
a thermoelectric cooling plate electrically connected in series with the thermoelectric cooling daisy chain; and
a heat sink physically connected with the thermoelectric cooling plate.

2. The three-dimensional integrated circuit structure of claim 1, wherein the three-dimensional chip stack comprises at least three integrated circuit chips.

3. The three-dimensional integrated circuit structure of claim 2, wherein each chip of the plurality of integrated circuit chips comprises a plurality of transistors and/or resistors formed thereon.

4. The three-dimensional integrated circuit structure of claim 1, wherein the thermoelectric cooling plate comprises a plurality of n-type semiconductive pellets and a plurality of p-type semiconductive pellets, and wherein each of the plurality of pellets is electrically connected in series with the thermoelectric cooling daisy chain.

5. The three-dimensional integrated circuit structure of claim 4, wherein at least one n-type semiconductive pellet is electrically connected in series with at least one p-type semiconductive pellet via an electrically conductive bridging connection.

6. The three-dimensional integrated circuit structure of claim 4, wherein the semiconductive pellets comprise bismuth telluride.

7. The three-dimensional integrated circuit structure of claim 4, wherein the thermoelectric cooling daisy chain comprises at least two vias formed directly over, and electrically connected in series with, each semiconductive pellet of the plurality of n-type and p-type semiconductive pellet.

8. The three-dimensional integrated circuit structure of claim 7, wherein, with respect to each semiconductive pellet, a first via of the at least two vias is formed within a first chip of the plurality of integrated circuit chips, and a second via of the at least two vias is formed within a second chip of the plurality of integrated circuit chips.

9. The three-dimensional integrated circuit structure of claim 8, wherein the second via over an n-type pellet and the second via of a p-type pellet are electrically connected to one another in series via an electrically conductive bridging connection.

10. The three-dimensional integrated circuit structure of claim 1, wherein the plurality of vias of the daisy chain are formed surrounding, but not within, an active area of the three-dimensional integrated circuit chip stack.

11. The three-dimensional integrated circuit structure of claim 1, wherein the plurality of vias of the daisy chain do not form any logical connections of the three-dimensional integrated circuit structure such that the plurality of vias are provided solely for heat dissipation purposes.

12. The three-dimensional integrated circuit structure of claim 1, wherein the thermoelectric cooling plate comprises a connection plate that physically connects the thermoelectric cooling plate to the heat sink.

13. The three-dimensional integrated circuit structure of claim 12, wherein the connection plate comprises an electrically insulative but thermally conductive material.

14. The three-dimensional integrated circuit structure of claim 13, wherein the heat sink comprises a plurality of fins for convectional dissipation of heat.

15. The three-dimensional integrated circuit structure of claim 14, wherein the heat sink comprises a thermally conductive material.

16. The three-dimensional integrated circuit structure of claim 1, wherein the thermoelectric cooling daisy chain is provide in a rectangular configuration that surrounds a rectangular three-dimensional integrated circuit chip stack.

* * * * *